(12) United States Patent
Shuey

(10) Patent No.: US 7,504,821 B2
(45) Date of Patent: Mar. 17, 2009

(54) AUXILIARY POWER SUPPLY FOR SUPPLYING POWER TO ADDITIONAL FUNCTIONS WITHIN A METER

(75) Inventor: Kenneth C. Shuey, Zebulon, NC (US)

(73) Assignee: Elster Electricity, LLC, Raleigh, NC (US)

( * ) Notice: Subject to any disclaimer, the term of this patent is extended or adjusted under 35 U.S.C. 154(b) by 0 days.

(21) Appl. No.: 11/266,413

(22) Filed: Nov. 3, 2005

(65) Prior Publication Data

US 2007/0096769 A1 May 3, 2007

(51) Int. Cl.
G01R 7/00 (2006.01)
(52) U.S. Cl. ...................................... 324/142
(58) Field of Classification Search ................. 324/142, 324/99 D, 103 R; 702/60–85; 340/870.01, 340/870
See application file for complete search history.

(56) References Cited

U.S. PATENT DOCUMENTS

| | | | |
|---|---|---|---|
| 4,179,654 A * | 12/1979 | Germer | 324/116 |
| 4,197,582 A * | 4/1980 | Johnston et al. | 702/58 |
| 4,987,363 A * | 1/1991 | Gibbs et al. | 324/142 |
| 5,014,213 A * | 5/1991 | Edwards et al. | 702/62 |
| 6,650,249 B2 | 11/2003 | Meyer et al. | 340/870.28 |
| 6,687,627 B1 | 2/2004 | Gunn et al. | 702/61 |
| 6,745,138 B2 | 6/2004 | Lightbody et al. | 702/61 |
| 6,819,226 B2 | 11/2004 | Randall | 340/333 |
| 6,844,825 B2 | 1/2005 | Shincovich | 340/870.02 |
| 7,091,878 B2 * | 8/2006 | Holle et al. | 340/870.02 |
| 2004/0128085 A1 | 7/2004 | Ramirez | 702/62 |

OTHER PUBLICATIONS

Turnbull, R., "AMR for a Cooperative World", *Electric Energy T & D Magazine*, 2004, www.electricenergyonline.com, 3 pages.

* cited by examiner

*Primary Examiner*—Vinh P Nguyen
(74) *Attorney, Agent, or Firm*—Woodcock Washburn LLP

(57) ABSTRACT

An electronic meter for measuring electricity consumption is provided that includes extra functionality without significantly increasing cost or complexity of the meter. The meter includes a capacitor for storing energy during normal operation of the meter. The output voltage of the capacitor is used as the input to an auxiliary power supply that is used to power the meter during a power outage. The auxiliary power supply may provide sufficient power to enable the meter to transmit a power outage signal to alert a utility of the power outage. Service disconnect circuitry is also included within the meter to disconnect or reconnect service to the load when desired. The energy stored on the capacitor can be used to energize a relay within the service disconnect circuitry to open or re-close the line to the load. Thus, the single capacitor is used to provide power to two different meter functions.

21 Claims, 6 Drawing Sheets

AUXILIARY POWER SUPPLY FOR SUPPLYING POWER TO ADDITIONAL FUNCTIONS WITHIN A METER

FIELD OF THE INVENTION

The present invention relates generally to utility meters. More particularly, the present invention is related to an electronic meter that efficiently provides auxiliary power to multiple functions within the meter during power outages.

BACKGROUND OF THE INVENTION

Electronic meters for measuring electric power consumption are rapidly replacing the more traditional electromechanical meters. As the focus towards electronic meters grows, so does the desire to minimize the costs of electronic meters. But the desire to minimize costs is juxtaposed with a desire to add functionality.

An electronic meter typically includes a power supply that receives the AC line voltage as its input and provides a lower voltage DC output (e.g., 5 or 12 volts DC) that is used to power the internal electronic components of the meter. The cost of a meter is proportional to the complexity. of its power supply. Therefore, a simpler power supply helps to lower the cost of the meter. When adding functionality to a meter, the ability of the power supply to support the added functionality can be a factor in the complexity of the power supply design. In addition to the complexity of the power supply, the number of other components needed to support the added functionality also influences the pricing of the meter. Clearly, fewer components in a meter results in a less expensive meter.

One added function presently found in some electronic meters is a remote service disconnect capability. This function allows a utility to transmit a signal to the meter to cause the meter to interrupt the AC line voltage to the customer site. When the meter receives such a signal, circuitry within the meter responds by energizing a relay within the meter that opens the line to the customer to interrupt service. In some electronic meters, the relay is powered by a capacitor within the meter that is charged from the AC line voltage so that, when a service disconnect signal is received, the voltage on the capacitor can be used to energize the relay coil.

Another desirable function included in some electronic meters is power outage signaling. Typically, this function is implemented by circuitry within the meter that detects an outage condition by, for example, monitoring the output of the meter power supply, and then transmits a signal to the utility to report the outage. The outage signal may be transmitted in a variety of ways, such as via telephone modem, power line communications, or wireless transmitter. Obviously, because this circuitry is reporting a power outage, some other source of power is needed to power the transmitting circuitry long enough to enable it to report the outage. One solution is to provide a battery within the meter as a back-up power source. But that solution increases the overall complexity and cost of the meter.

Accordingly, there is a need for new ways to provide power within an electronic meter to support added functionality, such as service disconnect and power outage signaling functionalities, without increasing the overall complexity, and hence cost, of a meter. The present invention satisfies this need.

SUMMARY OF THE INVENTION

The present invention provides a meter that incorporates service disconnect and auxiliary power supply functionalities, wherein the functionalities are powered by the same source. According to the present invention, a capacitor, which is charged by the AC line voltage during normal operation of the meter, is coupled to service disconnect circuitry and to an auxiliary power supply. The two meter functionalities do not overlap during normal operation of the meter, as the auxiliary power supply functionality is only required when the AC line voltage to the meter is interrupted. The auxiliary power supply can provide temporary power to the meter electronics to support the operation of certain meter functions, such as power outage signaling, for an amount of time following a power outage.

In an embodiment of the invention, a relay is coupled to the power line and to the capacitor to implement the service disconnect functionality of the meter. In response to a service disconnect signal from a utility, meter circuitry directs the energy from the capacitor to the relay to open the power line to the load at the indicated customer, thereby interrupting power to the customer. In the event of a power failure, the energy from the capacitor is instead used as the input to an auxiliary power supply that provides temporary power to the meter. In one embodiment, the auxiliary power supply is used to power a transmitter that transmits power outage signals to notify the utility of the power failure.

Other advantages and features of the invention are described below.

BRIEF DESCRIPTION OF THE DRAWINGS

The foregoing summary and the following detailed description of the invention are better understood when read in conjunction with the appended drawings. Exemplary embodiments of the invention are shown in the drawings, however, it is understood that the invention is not limited to the specific methods and instrumentalities depicted therein. In the drawings.

DETAILED DESCRIPTION OF ILLUSTRATIVE EMBODIMENTS

Figure 1:
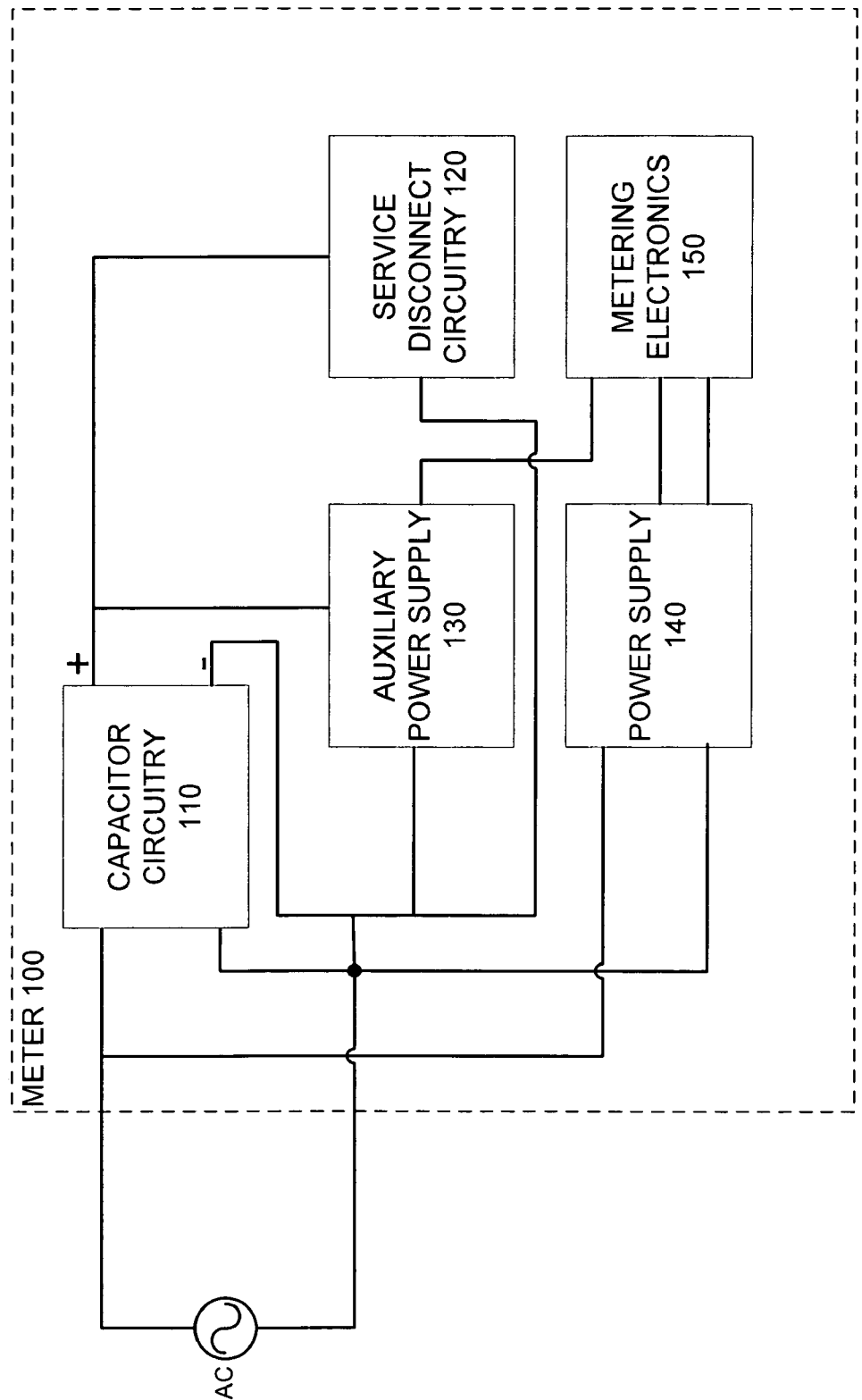
FIG. 1 is a block diagram illustrating the inclusion of a service disconnect function and an auxiliary power supply into an electronic meter for measuring electric power consumption, in accordance with one embodiment of the present invention.

FIG. 1 is a block diagram illustrating the incorporation of service disconnect circuitry 120 and an auxiliary power supply 130 into an electronic meter 100 in accordance with one embodiment of the present invention. The service disconnect circuitry 120 and the auxiliary power supply 130 are both coupled to the output of a capacitor circuitry 110 and both may receive, as an input, the output voltage of the capacitor circuitry 110. The AC line voltage feeds a power supply 140 that powers the internal components of the meter 100 (identified generally as metering electronics 150) during normal operation. The AC line voltage is also used in this embodiment to provide a DC voltage charge on the output of the capacitor circuitry 110 during normal operation of the meter 100.

The metering electronics 150 may be coupled to the service disconnect circuitry 120. The metering electronics 150 may also be coupled to the auxiliary power supply 130. The auxiliary power supply 130 may be used to power the metering electronics 150 when the power supply 140 is not operating, due, for example, to a power outage.

Figure 2:
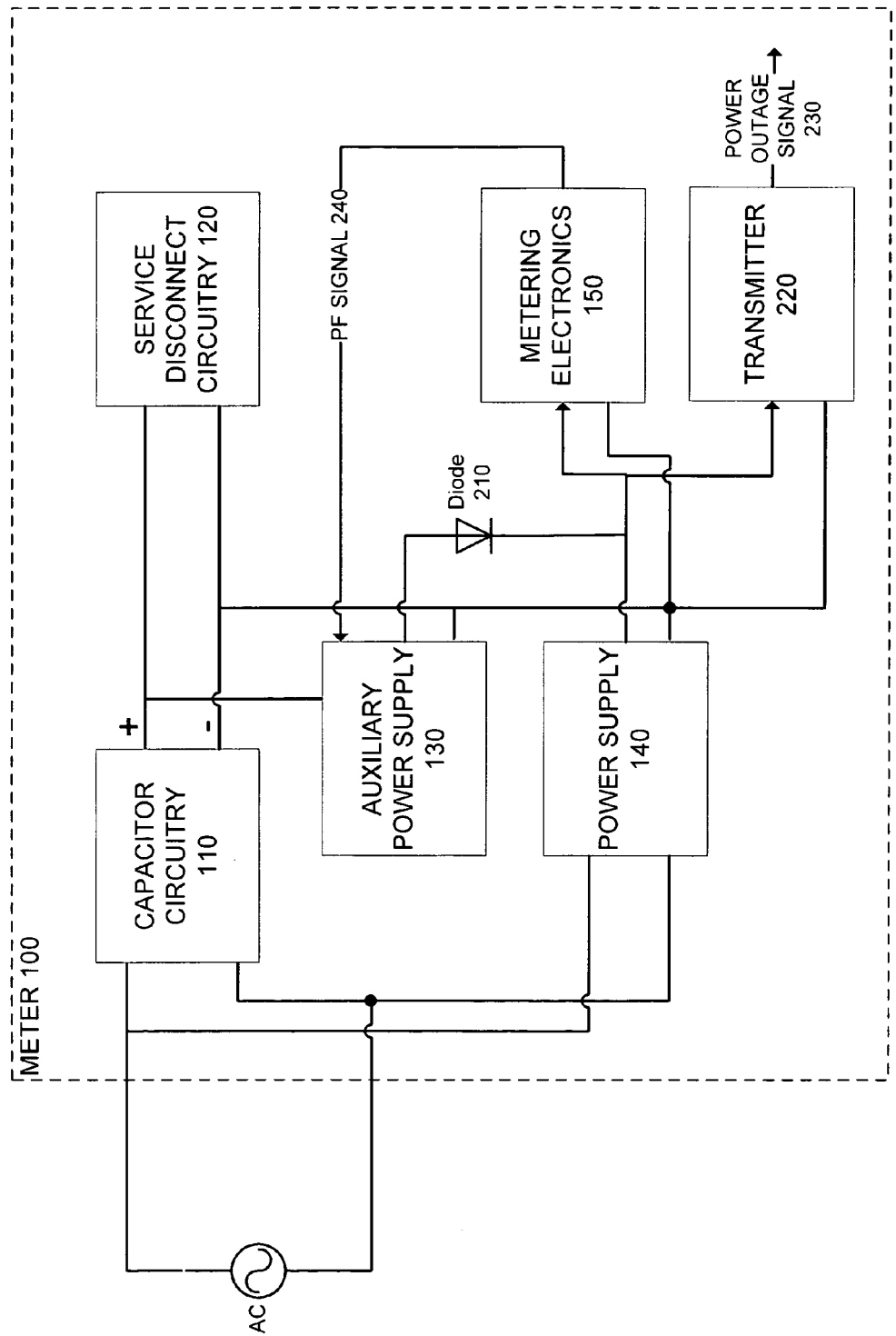
FIG. 2 provides further details of the auxiliary power supply of FIG. 1, in accordance with an embodiment of the present invention.
Figure 3:
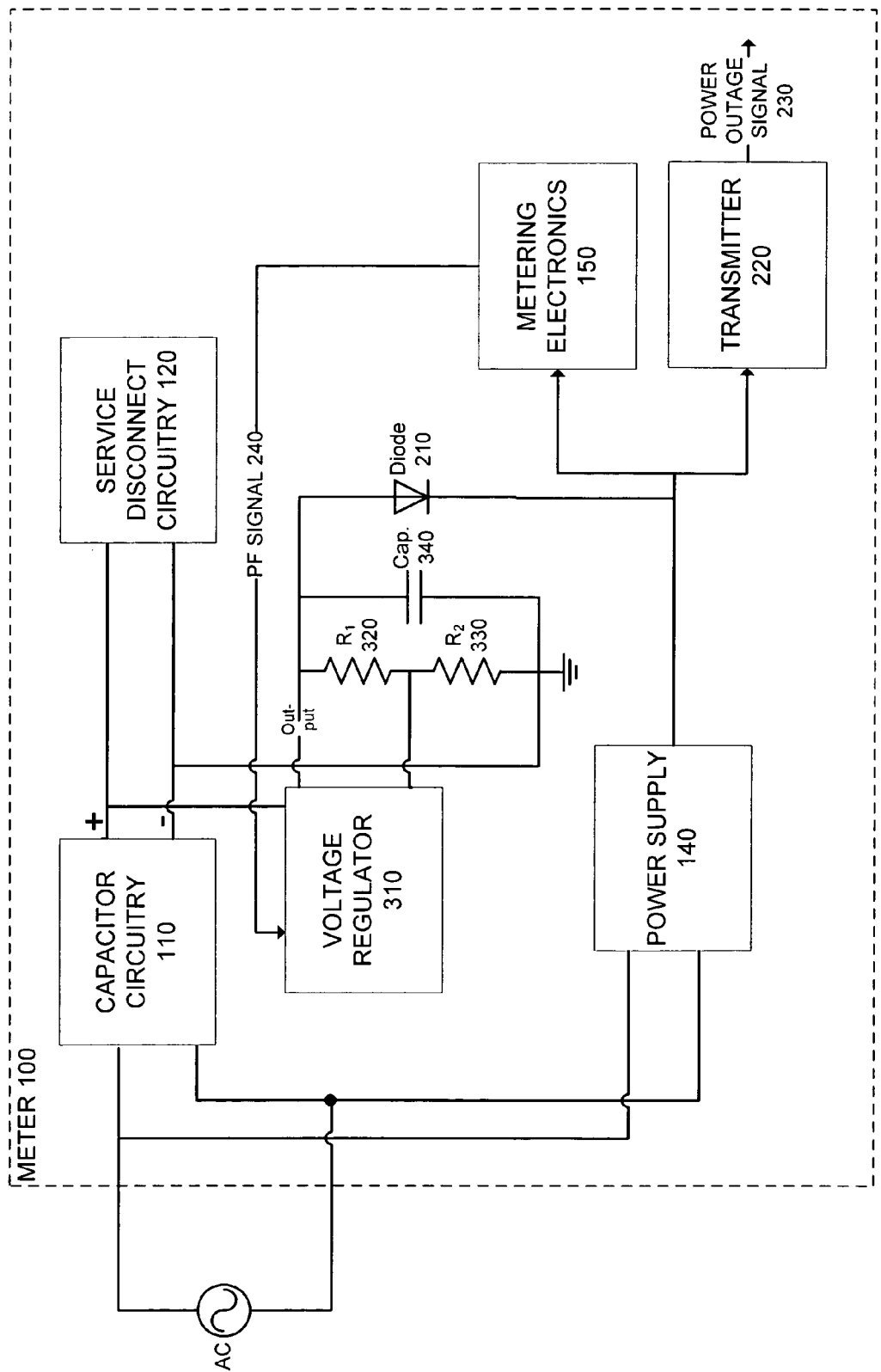
FIG. 3 provides still further details of the auxiliary power supply of FIG. 1, in accordance with an embodiment of the present invention.

FIGS. 2 and 3 provide further details of the auxiliary power supply 130, in accordance with an embodiment of the present invention, and also illustrate an exemplary use of the auxiliary power supply 130 to provide power to the metering electronics 150 and a transmitter 220 during a power outage so that a power outage signal may be transmitted, alerting a utility that the power outage has occurred.

In the example embodiment illustrated in FIG. 2, a diode 210 is connected between the output of the auxiliary power supply 130 and the output of the power supply 140. Preferably, during normal operation, the output voltage of the auxiliary power supply 130 (e.g., 6.0 volts) is less than the normal operating voltage produced by the power supply 140 (e.g., 6.4 volts). During normal operation, the diode 210 prevents contention between the outputs of the power supplies, and the power supply 140 operates normally to provide power to the electronic components of the meter 100. However, when a power failure occurs, the power supply 140 cannot generate the power (e.g., the 6.4 volts) required to operate the electronic components of the meter 100. In this case, the energy stored in the capacitor circuitry 110 can be used as the input voltage to the auxiliary power supply 130. When the AC line voltage fails, the output voltage of the auxiliary power supply 130 will be greater than that of the power supply 140 (which will essentially fall to zero volts), resulting in the metering electronics 150 and other electronic components of the meter receiving power from the auxiliary power supply 130.

In one embodiment of the present invention, the auxiliary power supply 130 is coupled to a transmitter 220. The auxiliary power supply 130 provides sufficient power to the transmitter 220 to enable a power outage signal 230 to be transmitted to notify the utility of the power failure. The transmitter 220 may be part of the metering electronics 150 or may be a separate component of the meter 100. The transmitter 220 may comprise any of a variety of signal transmission devices, such as, for example, a telephone modem, a power line communications device, or a wireless transmitter.

In one embodiment, the auxiliary power supply 130 may include a shutdown feature in which the auxiliary power supply 130 is in a "shutdown mode," and hence does not function, unless activated by a signal. Such a signal may be, for example, a power fail signal 240 which is generated by the metering electronics 150 when the output voltage of the power supply 140 goes below a predetermined, threshold voltage level. The power fail signal 240 essentially turns on the auxiliary power supply 130, which then uses the energy from the capacitor circuitry 110 to power the components of the meter 100, such as the transmitter 220 or the metering electronics 150.

FIG. 3. provides further details of the auxiliary power supply 130, in accordance with an embodiment of the present invention. In this embodiment, the auxiliary power supply 130 comprises a voltage regulator 310. The voltage regulator 310 operates to maintain a constant output voltage. In the event of a power failure, the power fail signal 240 generated by the metering electronics 150 causes the voltage regulator 310 to leave a shutdown mode. The voltage regulator 310 then draws energy from, i.e., receives the output voltage of, the capacitor circuitry 110 and produces therefrom a regulated output voltage. This regulated output voltage is utilized for powering the meter 100, including for example the metering electronics 150 and transmitter 220, during the power failure. The voltage regulator 310 may comprise any suitable form of voltage regulator. For example, in one embodiment, the voltage regulator 310 may comprise a switching regulator. In another embodiment, the voltage regulator 310 may comprise a linear regulator.

As further shown in FIG. 3, in this embodiment, two resistors, $R_1$ 320 and $R_2$ 330, are included to set the output voltage of the voltage regulator 310. The ratio of the resistors $R_1$ 320 and $R_2$ 330 ensures that the output voltage (e.g., 6.0 volts) is less than the normal operating voltage produced by the power supply 140. Additionally, a capacitor 340 may be included in the auxiliary power supply 130 to provide stability to prevent oscillations at the output of the voltage regulator 310.

Figure 4:
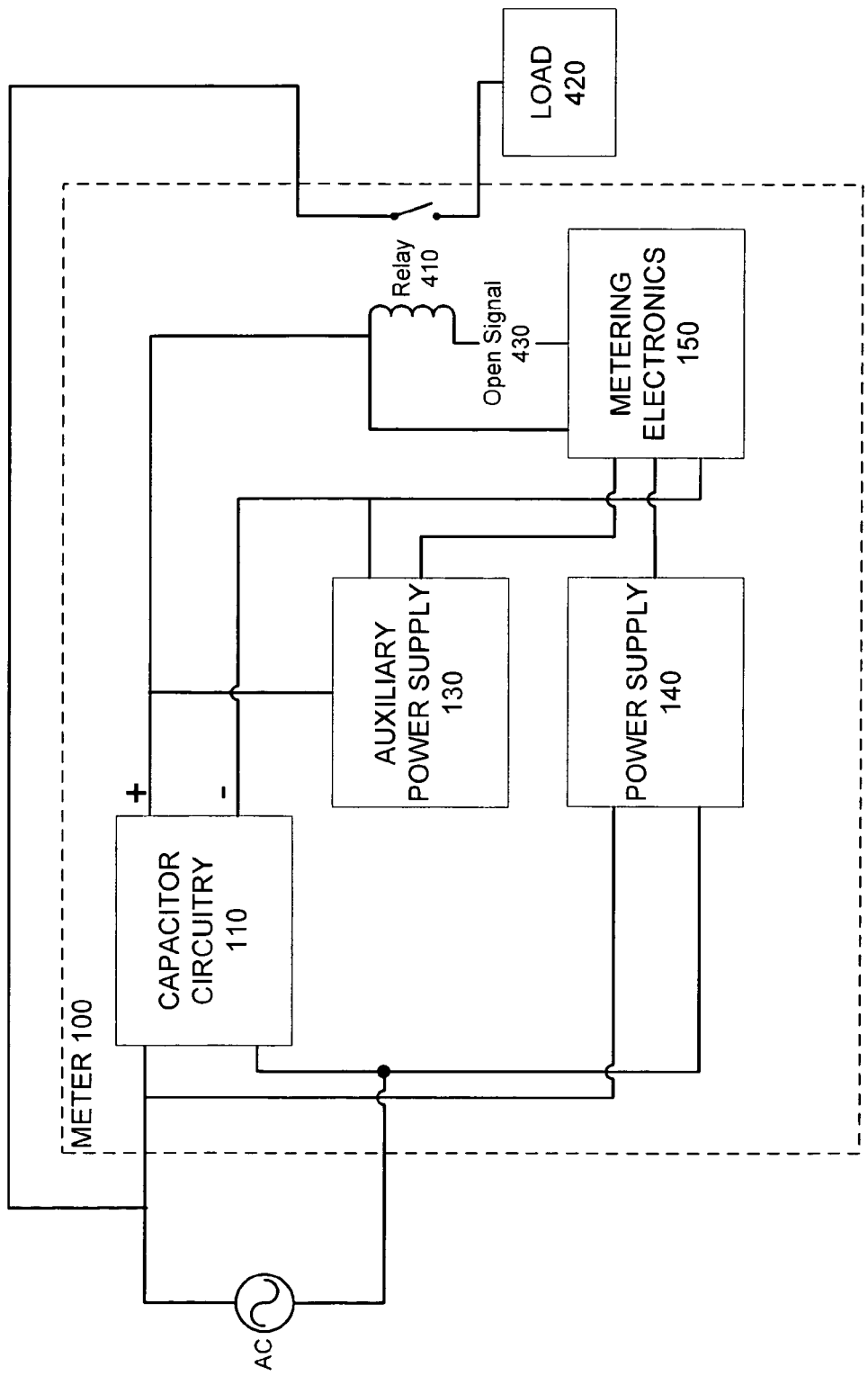
FIG. 4 illustrates an implementation of a service disconnect functionality in an electronic meter, in accordance with an embodiment of the present invention.

FIG. 4 provides further details of the service disconnect circuitry 120 of FIG. 1, in accordance with an embodiment of the present invention. As shown, the service disconnect circuitry 120 comprises a relay 410 which is coupled to the capacitor circuitry 110 and to a load 420 at a customer site. During normal operation of the meter 100, the relay 410 is not energized and the load 420 remains connected to the line. At some point, a utility may wish to disconnect power to the load 420. In a meter that includes service disconnect circuitry, the utility typically will transmit a signal, such as signal 430, indicating to the meter 100 the decision to disconnect power to the load 420. The meter 100 will respond to the signal by energizing the relay 410, which opens the line to the load 420, thereby interrupting service. As mentioned above, in accordance with the present invention, the energy stored on the capacitor circuitry 110 is used to energize the relay coil. The energy in the capacitor circuitry 110 may also be utilized to re-close the relay 410, thereby supplying service to the load 420.

Figure 5:
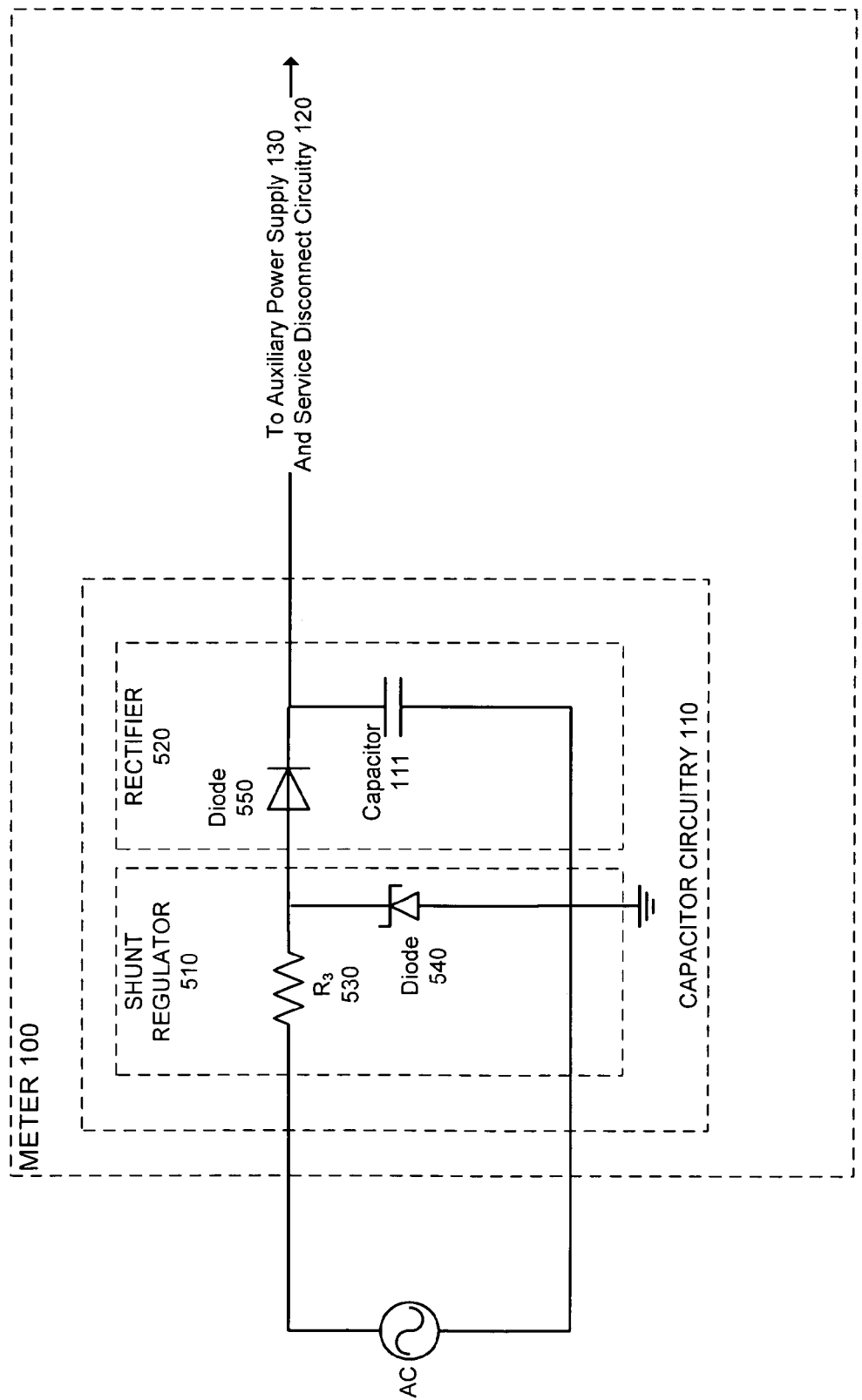
FIG. 5 illustrates an implementation for developing the energy necessary for powering the auxiliary power supply and the service disconnect functionality, in accordance with an embodiment of the present invention.
Figure 6:
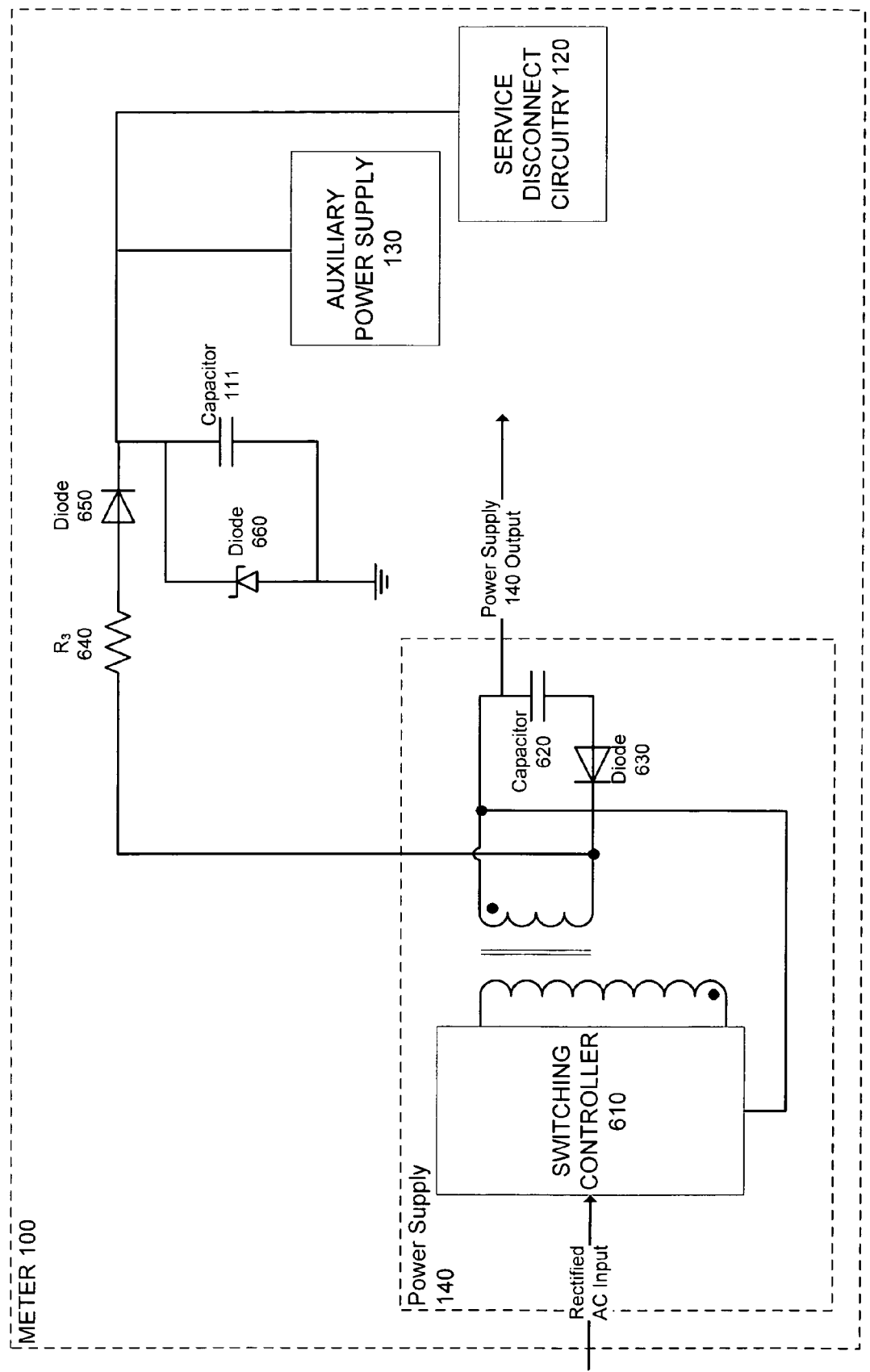
FIG. 6 illustrates a further implementation for developing the energy necessary for powering the auxiliary power supply and the service disconnect functionality, in accordance with an embodiment of the present invention.

FIGS. 5 and 6 illustrate exemplary embodiments for developing the energy stored on the capacitor circuitry 110. In the embodiment illustrated in FIG. 5, a shunt regulator 510 and a rectifier 520, coupled to form the capacitor circuitry 110, are incorporated to minimize ripple and reduce variations in the AC line voltage. The shunt regulator 510 comprises a resistor $R_3$ 530 and a diode 540 and operates to produce a near-constant voltage across its output. The rectifier 520, comprising a diode 550 and a capacitor 111, reduces the slight variations in the output of the shunt regulator 510. This provides a constant voltage, in the capacitor 111, with which to power the service disconnect circuitry 120 and the auxiliary power supply 130.

FIG. 6 illustrates an embodiment in which the capacitor 111 is charged from a switching power supply, which may be the power supply 140. The AC line voltage is rectified and powers the switching controller 610. As is conventional in a switching power supply, the output voltage of the supply is fed back to the switching controller 610, which adjusts the duty cycle of a switch (not shown) to control the amount of energy transferred from the primary winding of the supply to the output winding, resulting in a constant output voltage level (e.g., 6.4 volts). The secondary voltage, present a few microseconds each cycle, charges the capacitor 111 during the switch's charge cycle.

The foregoing examples have been provided merely for the purpose of explanation and are in no way to be construed as limiting of the present invention. While the invention has been described with reference to various embodiments, it is understood that the words which have been used herein are words of description and illustration, rather than words of limitation. Further, although the invention has been described with reference to particular means, materials and embodiments, the invention is not intended to be limited to the particulars disclosed but rather is intended to cover all modifications that are within the spirit and scope of the invention as defined by the appended claims.

What is claimed:

1. A meter for measuring the consumption of electricity by a load coupled to a power line, the meter comprising:
    a capacitor;
    a relay coupled to the power line and to the capacitor; and
    an auxiliary power supply coupled to the capacitor that receives as an input the output voltage from the capacitor for use in powering the meter during a power outage.

2. The meter of claim 1, further comprising a transmitter that, during a power outage, is powered by the auxiliary power supply and transmits a power outage signal.

3. The meter of claim 1, wherein the capacitor is charged during normal operation of the meter.

4. The meter of claim 1, wherein the relay operates to disconnect the load from the power line or reconnect the load to the power line when energized by the output voltage of the capacitor.

5. The meter of claim 4, further comprising metering electronics coupled to the relay, wherein the metering electronics operate to direct the output voltage of the capacitor to the relay.

6. The meter of claim 1, wherein the output voltage of the auxiliary power supply is less than the output voltage of a primary power supply of the meter.

7. The meter of claim 1, wherein the auxiliary power supply comprises a voltage regulator.

8. The meter of claim 7, wherein the auxiliary power supply farther comprises a pair of resistors coupled to the output of the voltage regulator to prevent the output voltage of the voltage regulator from exceeding a predetermined voltage.

9. The meter of claim 1, wherein the capacitor is charged by one of (i) a switching power supply and (ii) a regulated and rectified AC line voltage signal.

10. A meter for measuring the consumption of electricity by a load coupled to a power line, the meter comprising:
    a capacitor;
    a service disconnect circuit coupled to the capacitor; and
    an auxiliary power supply coupled to the capacitor that receives as an input the output voltage from the capacitor for use to power the meter during a power outage.

11. The meter of claim 10, further comprising a transmitter that, during a power outage, is powered by the auxiliary power supply and transmits a power outage signal.

12. The meter of claim 10, wherein the capacitor is charged during normal operation of the meter.

13. The meter of claim 10, wherein the service disconnect circuit operates to disconnect the load from the power line or reconnect the load to the power line when energized by the output voltage of the capacitor.

14. The meter of claim 13, further comprising metering electronics coupled to the service disconnect circuit, wherein the metering electronics operate to direct the output voltage of the capacitor to the service disconnect circuit.

15. The meter of claim 10, wherein the service disconnect circuit comprises a relay coupled to the power line.

16. The meter of claim 10, wherein the output voltage of the auxiliary power supply is less than the output voltage of a primary power source of the meter.

17. The meter of claim 10, wherein the auxiliary power supply comprises a voltage regulator.

18. The meter of claim 17, wherein the auxiliary power supply further comprises a pair of resistors coupled to the output of the voltage regulator to prevent the output voltage of the voltage regulator from exceeding a predetermined voltage.

19. The meter of claim 10, wherein the capacitor is charged by one of (i) a switching power supply and (ii) a regulated and rectified AC line voltage signal.

20. A meter for measuring the consumption of electricity by a load coupled to a power line, the meter comprising:
    a capacitor;
    a relay coupled to the capacitor, wherein the relay operates to disconnect the load from the power line or reconnect the load to the power line when energized by the output voltage of the capacitor;
    a power supply for powering the meter during normal operation;
    an auxiliary power supply coupled to the capacitor that receives, as an input, the output voltage from the capacitor for powering the meter during a power outage; and
    metering electronics coupled to both the power supply and the auxiliary power supply and powered by the auxiliary power supply during a power outage.

21. The meter of claim 10, wherein the service disconnect circuit is operable to cause the meter to interrupt voltage from the power line.

* * * * *

UNITED STATES PATENT AND TRADEMARK OFFICE
CERTIFICATE OF CORRECTION

PATENT NO. : 7,504,821 B2  Page 1 of 1
APPLICATION NO. : 11/266413
DATED : March 17, 2009
INVENTOR(S) : Kenneth C. Shuey It is certified that error appears in the above-identified patent and that said Letters Patent is hereby corrected as shown below:

COL. 5, line 41 (Claim 8): delete "farther" and substitute therefor --further--

Signed and Sealed this

Twenty-eighth Day of April, 2009

JOHN DOLL
*Acting Director of the United States Patent and Trademark Office*